(12) United States Patent
Kelma et al.

(10) Patent No.: US 8,207,727 B2
(45) Date of Patent: Jun. 26, 2012

(54) RF CIRCUIT ANALYSIS

(75) Inventors: Christophe Kelma, Bayeux (FR);
Sofiane Ellouz, Caen (FR)

(73) Assignee: NXP B.V., Eindhoven (NL)

( * ) Notice: Subject to any disclaimer, the term of this patent is extended or adjusted under 35 U.S.C. 154(b) by 410 days.

(21) Appl. No.: 12/519,161

(22) PCT Filed: Dec. 13, 2007

(86) PCT No.: PCT/IB2007/055076
§ 371 (c)(1),
(2), (4) Date: Jun. 13, 2009

(87) PCT Pub. No.: WO2008/072202
PCT Pub. Date: Jun. 19, 2008

(65) Prior Publication Data
US 2010/0013455 A1    Jan. 21, 2010

(30) Foreign Application Priority Data
Dec. 15, 2006    (EP) .................................. 06291953

(51) Int. Cl.
*G01R 23/16* (2006.01)
(52) U.S. Cl. ................ 324/76.12; 324/76.23; 324/76.43
(58) Field of Classification Search ........................ None
See application file for complete search history.

(56) References Cited

U.S. PATENT DOCUMENTS

| 5,059,915 A | 10/1991 | Grace et al. |
| 5,420,552 A | 5/1995 | Sakka |
| 7,088,109 B2 * | 8/2006 | Tanbakuchi .................. 324/622 |

FOREIGN PATENT DOCUMENTS

| EP | 753938 A1 | 1/1997 |
| WO | 2004/015431 A | 2/2004 |
| WO | 2004019508 A1 | 3/2004 |
| WO | 2004106956 A1 | 12/2004 |

* cited by examiner

*Primary Examiner* — Minh N Tang

(57) ABSTRACT

An analysis circuit for analysing the RF response of an RF circuit, includes a voltage controlled oscillator (12), wherein a signal derived from voltage controlled oscillator output is applied as input to the RF circuit (10). A first mixer (18) mixes the RF circuit output with a first mixer signal derived from the voltage controlled oscillator and a second mixer (20) mixes the RF circuit unit output with a second mixer signal derived from the voltage controlled oscillator, the first and second mixer signals being 90 degrees out of phase. The mixer output signals are processed to provide the analysis. This analysis circuit uses mixers to enable baseband digital signal processing of signals to enable a frequency response characteristic of the RF circuit to be obtained. The analysis circuit essentially operates in the manner of an IF demodulator circuit.

13 Claims, 2 Drawing Sheets

RF CIRCUIT ANALYSIS

This invention relates to RF circuit analysis, and particularly but not exclusively to testing of RF integrated circuits using test circuitry which is integrated with the RF circuits.

The RF measurements required for testing or analysis of RF integrated circuits are difficult to obtain and expensive, as they require high end test equipment and expensive test apparatus such as RF probe cards and contact blocks.

In particular, RF circuit testing typically requires a sweep of the RF frequency range of the RF circuit (for example a filter) and a measurement of the response of the filter. This response may be in the RF spectrum or in an intermediate frequency (IF) spectrum when a circuit being tested is in an IF part of the circuit. This is the case for a down-mixer architecture, for example as used in the receive path of an RF transceiver. Thus, the RF testing requires an RF generator, RF measurement capabilities, a connection arrangement such as RF probe card, and also requires a prolonged test time.

Typically, a full sweep of the RF frequency is not implemented in production testing, because this is too time consuming, and instead only the response at discrete frequency points is measured.

For production of standalone RF filters (for example Surface Acoustic Wave "SAW" and Bulk Acoustic Wave "BAW" filters), the manufacturer needs to measure accurately the filter shape at RF, and this requires a Vector Network Analyser (VNA). This gives high costs and long testing time.

There has been much research in RF testing, which aims to improve testability of RF ICs, by extending the test coverage and simplify the processes to reduce cost. One approach is to provide integrated testing circuitry, resulting in a DFT (Design For Test) approach. The integration of testing circuitry into production circuits is an attractive way to allow IC testing at production. This is particularly attractive for RF designs in CMOS, in which RF, Mixed-Signal and Digital processing blocks are integrated into ICs.

According to the invention, there is provided an analysis circuit for analysing the RF response of an RF circuit, comprising:

a voltage controlled oscillator, wherein a signal derived from the voltage controlled oscillator output is applied as input to the RF circuit;

control circuitry for controlling the voltage controlled oscillator;

a first mixer for mixing the RF circuit output with a first mixer signal derived from the voltage controlled oscillator;

a second mixer for mixing the RF circuit output with a second mixer signal derived from the voltage controlled oscillator, the first and second mixer signals being 90 degrees out of phase; and a digital signal processor for processing the mixer output signals.

This analysis circuit uses mixers to enable baseband digital signal processing of signals to enable a frequency response characteristic of the RF circuit to be obtained. The analysis circuit essentially operates in the manner of an IF demodulator circuit.

The voltage controlled oscillator is preferably used to sweep through a desired analysis frequency range, and the analysis circuit functions as a zero-IF demodulator to convert the RF frequency response to a DC response.

A phase shift circuit is preferably provided between the voltage controlled oscillator and the RF circuit, wherein the first mixer signal comprises the voltage controlled oscillator output and the second mixer signal comprises the phase shift circuit output.

The digital signal processor can compute the sum of the squares of the mixer output signals from the first and second mixers. This can be used to derive the RF circuit transfer function for the particular frequency. In particular, the digital signal processor may compute a transfer function of the RF circuit at a frequency f as:

$$B(f) = \frac{2}{A_{vco}} \sqrt{(IF1^2 + IF2^2)}$$

where B(f) is the RF circuit transfer function for a frequency f corresponding to the voltage controlled oscillator output frequency, $A_{co}$ is the amplitude of the voltage controlled oscillator output, IF1 is the output of the first mixer and IF2 is the output of the second mixer.

The testing circuit can be used within an integrated circuit which includes the RF circuit to be analysed. This provides an integrated embedded design for test solution, and which can avoid the need for RF instrumentation.

The RF circuit may for example comprise an RF filter (e.g. SAW filter, Band Pass filter, Low Pass filter, High Pass filter).

The invention also provides an analysis system, comprising:

a first analysis circuit of the invention for processing signals from an RF circuit under analysis;

a second analysis circuit of the invention for processing signals from a reference RF circuit; and a comparator for comparing the RF circuit response of the RF circuit under test with the RF circuit response of the reference RF circuit.

This can provide a bench testing circuit for testing or analysing RF circuits. The reference circuit is a so-called golden circuit, having the desired transfer function. This is a circuit of the same type as the circuit being tested and which is known to have the correct desired operation.

The first and second analysis circuits can share the voltage controlled oscillator and the control circuitry for controlling the voltage controlled oscillator, so that the amount of circuitry can be reduced compared to a simple duplication.

The analysis system may comprise an integrator for deriving an integral differential error between the reference circuit response and the RF circuit under test.

The invention also provides a method of analysing the RF response of an RF circuit, comprising:

generating an input signal having a controlled set frequency and applying a signal with the set frequency to an input of the RF circuit;

mixing the RF circuit output with a first mixer signal having the set frequency;

mixing the RF circuit unit output with a second mixer signal having the set frequency, the first and second mixer signals being 90 degrees out of phase;

processing the mixer output signals to derive a response of the RF circuit at the set frequency; and repeating the method for different set frequencies.

This method can simplify the test setup, as no external RF generator and RF detection circuits are required needed. The method can provide good test coverage, as a frequency sweep can be implemented by the control of the set frequency.

Embodiments of the invention will now be described, purely by way of example, with reference to the accompanying drawings, in which.

The invention provides an analysis circuit for analysing the RF response of an RF circuit, in which an IQ (In-Plane and Quadrature) zero-IF demodulator configuration is used to provide down-mixed DC signals which can be processed to derive the RF response. This can for example be used for circuit testing.

This provides an architecture which can be implemented directly on silicon, and which operates by generating an RF signal and sweeping its frequency over a certain bandwidth, converting the RF frequency response of the filter to a DC response, and computing the signature with a DSP.

Figure 1:
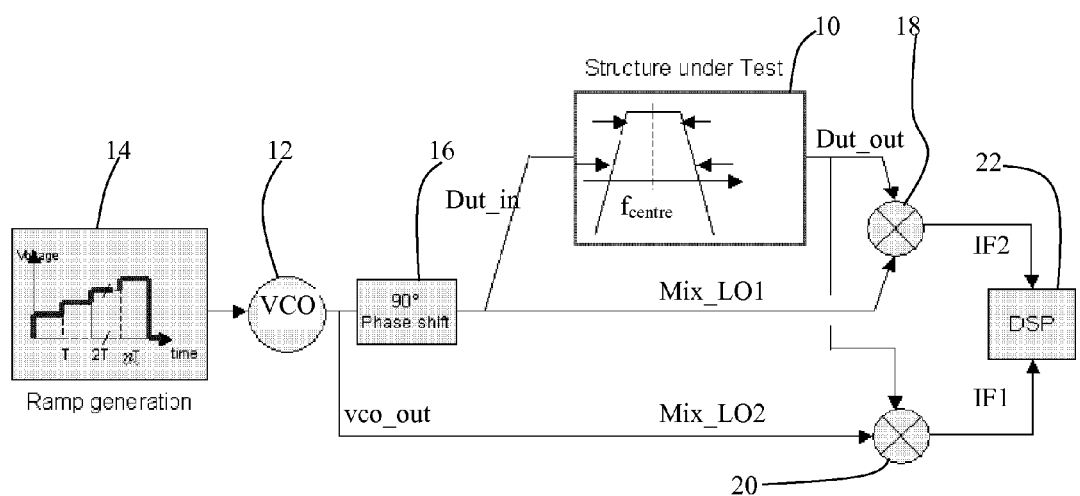
FIG. 1 shows a first example of testing circuit of the invention.

FIG. 1 shows a first example of testing circuit of the invention.

The RF circuit to be tested is shown as 10, and is represented by a filter response characteristic. The test circuit has a voltage controlled oscillator 12 controlled by a ramp (or stepped ramp) signal 14. This ramp signal is the output from a control circuit (not shown). The output of the voltage controlled oscillator 12 is phase shifted by 90 degrees by phase shifter 16 and is then applied as input Dut_in (Device Under Test In) to the RF circuit 10.

A first mixer 18 mixes the RF circuit output Dut_out (Device Under Test Out) with a first mixer signal Mix_LO1 (which is the phase shifted signal) and a second mixer 20 mixes the RF circuit unit output with a second mixer signal Mix_LO2 which is the voltage controlled oscillator output Vco_out. The mixer output signals IF1 and IF2 are processed in a DSP 22 to derive the RF circuit transfer function. The DSP includes analogue to digital conversion.

The principle of operation of this circuit is based on the operation of an IQ zero-IF demodulator architecture, in which quadrature signals at a particular frequency are used to downcovert a signal being demodulated to derive in-plane and quadrature demodulated components. These demodulation signals can be used to derive the response of an RF circuit to a stimulus at the particular frequency. The operation of the circuit is explained mathematically below.

The voltage controlled oscillator output signal can be written as:

$$\text{vco\_out} = A_{vco} \times \cos[\omega(t) \cdot t]$$

$\omega(t)$ is time dependant and is linked to the DC ramp definition, and $A_{VCO}$ is the amplitude of the voltage controlled oscillator output.

The input signal for the filter 10 can be written as:

$$\text{Dut\_in} = A_{vco} \times \cos\left[\omega(t) \cdot t + \frac{\pi}{2}\right]$$

The loss attenuations can be taken into account by replacing $A_{VCO}$ by $A_{VCO}/\text{path\_loss}$, but it is also possible to use an attenuator on the Mix_LO2 path in order to compensate for the losses.

The output response of the filter can be written:

$$\text{Dut\_out} = B(f) \times \cos\left[\omega(t) \cdot t + \frac{\pi}{2} + \varphi(f)\right]$$
$$= B(f) \times \sin[\omega(t) \cdot t + \varphi(f)]$$

where B(f) represents the filter frequency response shape, and $\phi(f)$ the group delay introduced by the filter, both of which are frequency dependant.

The outputs of the mixers are defined as IF1 and IF2, and these are:

$$IF1 = \text{mix\_LO1} \times \text{DUT\_out} = \text{DUT\_in} \times \text{DUT\_out}$$
$$IF1 = \frac{A_{vco}}{\text{loss}} \times \cos\left[\omega(t) \cdot t + \frac{\pi}{2}\right] \times B(f) \times \cos\left[\omega(t) \cdot t + \frac{\pi}{2} + \varphi(f)\right]$$
$$IF1 = \frac{A_{vco} \times B(f)}{2} \times [\cos(2\varpi(t) \cdot t + \varphi(f) + \pi) + \cos(\varphi(f))]$$

The VHF frequency in 2ω can be filtered out, to give:

$$IF1 \propto \frac{A_{vco} \times B(f)}{2} \times \cos(\varphi(f))$$

For the second mixer output:

$$IF2 = \text{mix\_LO2} \times \text{DUT\_out} = \text{vco\_out} \times \text{DUT\_out}$$
$$IF2 = A_{vco} \times \cos[\omega(t) \cdot t] \times B(f) \times \cos\left[\omega(t) \cdot t + \frac{\pi}{2} + \varphi(f)\right]$$
$$IF2 = A_{vco} \times \cos[\omega(t) \cdot t] \times B(f) \times \sin[\omega(t) \cdot t + \varphi(f)]$$
$$IF2 = \frac{A_{vco} \times B(f)}{2} \times [\sin(2\varpi(t) \cdot t + \varphi(f) + \pi) + \sin(\varphi(f))]$$

Again, the VHF frequency in 2ω can be filtered out to give:

$$IF2 \propto \frac{A_{vco} \times B(f)}{2} \times \sin(\varphi(f))$$

The aim is to obtain the B(f) curve, and it is shown below that this can be obtained from a sum of squares of the mixer output signals:

$$IF1^2 + IF2^2 = \left(\frac{A_{vco} \times B(f)}{2}\right)^2 \times (\sin^2(\varphi(f)) + \cos^2(\varphi(f)))$$
$$= \left(\frac{A_{vco} \times B(f)}{2}\right)^2$$

Assuming that the amplitude of the VCO output signal can be measured, the following expression is obtained:

$$B(f) = \frac{2}{A_{vco}} \sqrt{(IF1^2 + IF2^2)}$$

where B(f) is the RF circuit transfer function for a frequency f corresponding to the set frequency, $A_{VCO}$ is the amplitude of the input signal, IF1 is the output of the first mixer and IF2 is the output of the second mixer.

This computation can be made with a basic DSP.

Figure 2:
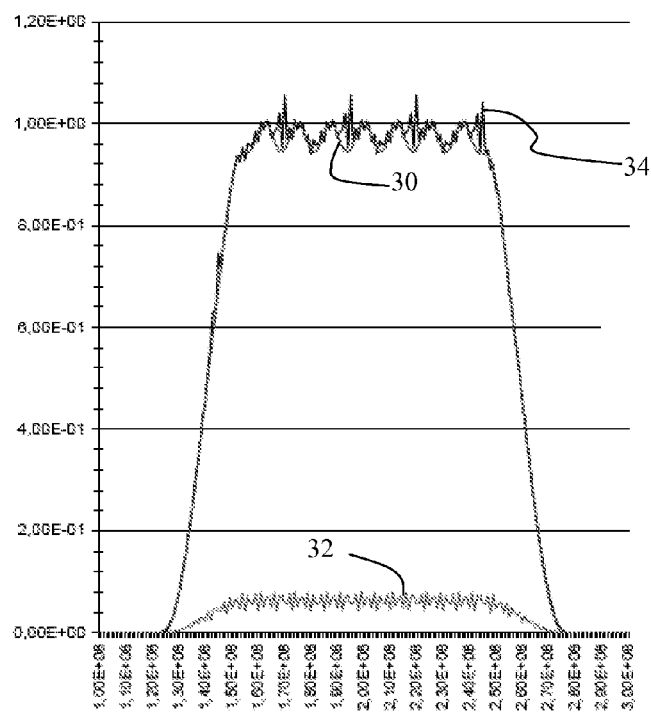
FIG. 2 shows the signals at different parts of the circuit of FIG. 1.

FIG. 2 shows simulations of these results. A SAW filter is modeled, and has a transfer function shown as plot 30.

The B(f) response, from DC measurements, is shown as plot 32, and plot 34 is the DC signature after amplification and averaging.

It can be seen that the RF response of a filter (or other circuit) can be verified with DC measurements, by means of Design For Test structures which can be integrated into IC packages.

The example above is a test circuit architecture to be integrated with the IC of an RF circuit to be tested. The circuit elements required may already exist in the IC. For example, if the circuit to be tested forms part of an RF transceiver in a CMOS process, the circuit will typically already require a 90° phase shifter, down mixers, a DSP engine, analogue to digital converters etc. The invention can thus be implemented by adding signal paths for test purposes, in order to obtain a DC signature of an RF transfer function of a part of the IC circuit, for example a SAW filter.

The invention concept can be applied to System In Package designs having integrated RF components such as filters. The invention enables a reduction in the cost of the test capability, avoiding the need for expensive RF testing equipment.

Another application of this concept can be to build up a complete low cost bench measurement for RF circuit test production, by associating the test circuit as shown above with a so-called "Golden" circuit (one with the desired performance). This involves comparing the device response to a reference device, and subtracting the dc responses of the two circuits, integrating the error, and screening out failed devices based on this criteria.

Figure 3:
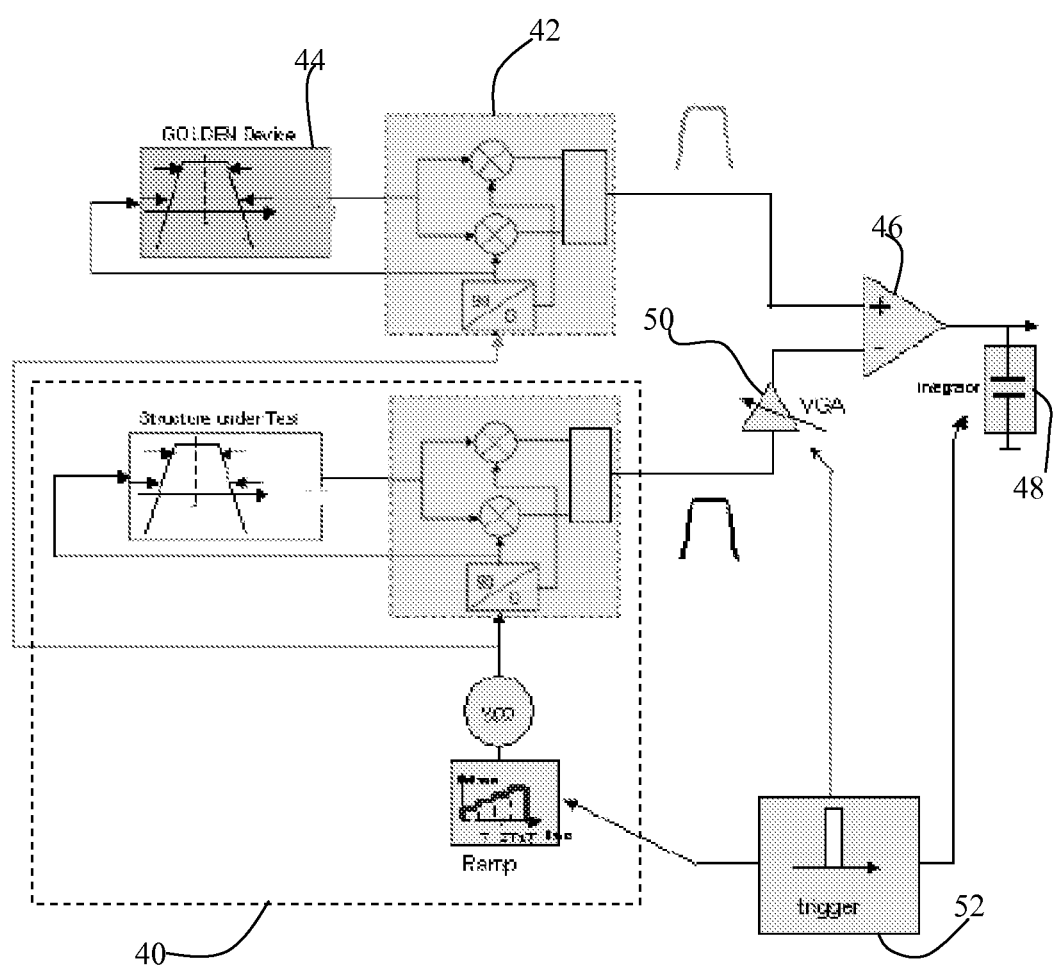
FIG. 3 shows a second example of testing circuit of the invention.

This arrangement is shown in FIG. 3 and comprises a circuit 40 corresponding to FIG. 1. The output of the voltage controlled oscillator of the circuit is also provided to the phase shifter of a second test circuit 42, which has the two mixers, phase shifter and processor corresponding to the circuit 40. The circuit 42 is for providing the transfer function of a Golden circuit 44 corresponding to the circuit under test.

This circuit thus comprises two test circuits 40 and 42, 44, with one of the test circuits operating as a reference. The two test circuit outputs are provided to a comparator 46, which outputs an error between the desired response at a given frequency as derived from the golden circuit and a measured response of the circuit under test.

This output is integrated in the integrator 48 for the multiple frequencies at which the test is carried out, so that an integrated differential error signal is obtained, which represents the difference between the measured and desired responses.

An extra variable gain amplifier (VGA) 50 can be added in the detection path of the device under test, in order to emphasize error observation in certain frequency regions.

The operation of the various components is timed by a trigger signal 52 in order to provided synchronization.

The invention has been described above for testing purposes, but it can also be used for calibration, for example for calibration of an operating frequency of a component, such as a VCO frequency, or a filter center frequency. It can also be used for calibration of variable bandwidth components. The circuit can also be used for other analyses of the frequency-dependent transfer function of RF components.

The invention can be used for testing in any frequency range or intermediate frequency range. For example, band pass filter responses in the GHz band can be tested (e.g. 1.85 GHz to 1.91 GHz).

The number of discrete steps (i.e. VCO control signals) needed to characterise the response will depend on the desired accuracy and the number of frequency points needed in the transfer function shape.

The invention can be used for testing of a variety of devices, but is of most interest for filters, such as standalone filters or filter blocks within a transceiver.

The functional units used to form the analysis circuit are all standard and the circuits have accordingly not been described in detail. Furthermore, only one example of circuit has been given to provide baseband (DC) processing of signals to derive a frequency response. Other designs will be possible, and some variations will be apparent from other designs of IQ demodulator.

Various other modifications will be apparent to those skilled in the art.

The invention claimed is:

1. An analysis circuit for analysing the RF response of an RF circuit, comprising:
   a voltage controlled oscillator, wherein a signal derived from the voltage controlled oscillator output is applied as input to the RF circuit;
   control circuitry for controlling the voltage controlled oscillator;
   a first mixer for mixing the RF circuit output with a first mixer signal derived from the voltage controlled oscillator;
   a second mixer for mixing the RF circuit output with a second mixer signal derived from the voltage controlled oscillator, the first and second mixer signals being 90 degrees out of phase; and
   a digital signal processor for processing the mixer output signals.

2. A circuit as claimed in claim 1, further comprising a phase shift circuit between the voltage controlled oscillator and the RF circuit, wherein the first mixer signal comprises the phase shift circuit output and the second mixer signal comprises the voltage controlled oscillator output.

3. A circuit as claimed in claim 1, wherein the digital signal processor computes the sum of the squares of the mixer output signals from the first and second mixers.

4. A circuit as claimed in claim 3, wherein the digital signal processor computes a transfer function of the RF circuit at a frequency f as:

$$B(f) = \frac{2}{A_{vco}} \sqrt{(IF1^2 + IF2^2)}$$

where B(f) is the RF circuit transfer function for a frequency f corresponding to the voltage controlled oscillator output frequency, $A_{VCO}$ is the amplitude of the voltage controlled oscillator output, IF1 is the output of the first mixer and IF2 is the output of the second mixer.

5. An integrated circuit comprising:
   the RF circuit; and
   the analysis circuit as claimed in claim 1.

6. An integrated circuit as claimed in claim 5, wherein the RF circuit comprises an RF filter.

7. A testing system, comprising:
   a first analysis circuit as claimed in claim 1, for processing signals from an RF circuit under analysis;
   a second analysis circuit as claimed in claim 1, for processing signals from a reference RF circuit; and
   a comparator for comparing the RF circuit response of the RF circuit under analysis with the RF circuit response of the reference RF circuit.

8. A testing system as claimed in claim 7, wherein the first and second analysis circuits share the voltage controlled oscillator and the control circuitry for controlling the voltage controlled oscillator.

9. A testing system as claimed in claim 7, further comprising an integrator for deriving an integral differential error between the reference circuit response and the RF circuit under analysis.

10. A method of analysing the RF response of an RF circuit, comprising:
   generating an input signal having a controlled set frequency and applying a signal with the set frequency to an input of the RF circuit;
   mixing the RF circuit output with a first mixer signal having the set frequency;
   mixing the RF circuit unit output with a second mixer signal having the set frequency, the first and second mixer signals being 90 degrees out of phase;
   processing the mixer output signals to derive a response of the RF circuit at the set frequency; and
   repeating the method for different set frequencies.

11. A method as claimed in claim 10, wherein processing the mixer output signals comprises computing the sum of the squares of the mixer output signals from the first and second mixers.

12. A method as claimed in claim 11, wherein processing the mixer output signals comprises computing a transfer function of the RF circuit at a frequency f as:

$$B(f) = \frac{2}{A_{vco}} \sqrt{(IF1^2 + IF2^2)}$$

where B(f) is the RF circuit transfer function for a frequency f corresponding to the set frequency, $A_{VCO}$ is the amplitude of the input signal, IF1 is the output of the first mixer and IF2 is the output of the second mixer.

13. A method as claimed in claim 10, further comprising comparing the RF circuit response of the RF circuit under analysis with the RF circuit response of a reference RF circuit.

* * * * *